United States Patent
Takenaka et al.

[11] Patent Number: 6,080,327
[45] Date of Patent: Jun. 27, 2000

[54] PIEZOELECTRIC CERAMIC COMPOSITION

[75] Inventors: Tadashi Takenaka, Kashiwa; Masakazu Hirose; Kazuo Miyabe, both of Tokyo, all of Japan

[73] Assignee: TDK Corporation, Tokyo, Japan

[21] Appl. No.: 09/263,783

[22] Filed: Mar. 5, 1999

[30] Foreign Application Priority Data

Mar. 6, 1998 [JP] Japan .................................. 10-073368

[51] Int. Cl.⁷ ........................ C04B 35/453; H01L 41/187
[52] U.S. Cl. ..................... 252/62.9 R; 501/134; 501/136
[58] Field of Search ...................... 252/62.9 R; 501/134, 501/136

[56] References Cited

FOREIGN PATENT DOCUMENTS 9-100156  4/1997  Japan .

*Primary Examiner*—C. Melissa Koslow
*Attorney, Agent, or Firm*—Oblon, Spivak, McClelland, Maier & Neustadt, P.C.

[57] ABSTRACT

A lead-oxide-free piezoelectric ceramic composition having an electromechanical coupling coefficient greater than a predetermined value and having a Curie point of at least 500° C., whose main component is a two-component-based solid solution of the formula of $(1-x)Bi_aTi_bNb_cO_9-xNa_pBi_qNb_rO_9$, and which has a bismuth layer structure in the range of $0<x<1$, the solid solution of the above formula satisfying $2.4<(1-x)a+xq<3.1$, $0<b<1.1$, $0.9<(1-x)c+xr<2.1$, and $0<p<0.6$.

1 Claim, 1 Drawing Sheet

PIEZOELECTRIC CERAMIC COMPOSITION

BACKGROUND OF THE INVENTION

1. Field of the Invention

The present invention relates to a piezoelectric ceramic composition for use in a pressure sensor for use at high temperatures, a resonator, and the like.

2. Background Art

At present, piezoelectric ceramics are widely used not only in the fields of conventional electronic machines and devices such as resonators and filters but also in products using charges and displacements such as sensors and actuators. Generally, the material therefor has been selected from ferroelectric materials having a perovskite structure such as lead zirconate titanate ("PZT" hereinafter) or lead titanate ("PT" hereinafter). These materials give excellent piezoelectric characteristics when a third component or additive is incorporated. Since, however, most of them as a practical composition have a Curie point of approximately 200° C. to 400° C., they become ordinary dielectric materials at temperatures higher than the above and lose piezoelectric characteristics, so that they can no longer be used at ultrahigh temperatures for a nuclear reactor and the like. Further, since the above materials contain approximately 60 to 70% by weight of lead oxide (PbO), they are undesirable in the ecological point of view and in view of the prevention of environmental pollution.

As a piezoelectric ceramic containing no lead oxide, $BaTiO_3$ having a perovskite structure similarly to the above materials is well known. Further, JP-A-9-100156 discloses a composition of $(BiNa)TiO_3$-$NaNbO_3$ which has a perovskite structure similarly to the above.

Of piezoelectric ceramic materials having the above compositions:

① $BaTiO_3$ has piezoelectric characteristic (electromechanical coupling coefficient) which is good to a great extent, while it has a Curie point of as low as 120° C., so that it is environmentally extremely limited in use.

② $(BiNa)TiO_3$-$NaNbO_3$ disclosed in JP-A-9-100156 has a large and excellent electromechanical coupling coefficient, while its Curie temperature is 370° C. or lower, so that it cannot be used at a temperature higher than the above.

SUMMARY OF THE INVENTION

It is therefore an object of the present invention to provide a piezoelectric ceramic composition which contains no lead oxide, has an electromechanical coupling coefficient greater than a predetermined value and shows a Curie temperature of 500° C. or higher.

According to the present invention, the above object of the present invention is achieved by a piezoelectric ceramic composition whose main component is a two-component-based solid solution of the formula of $(1-x)Bi_aTi_bNb_cO_9$-$xNa_pBi_qNb_rO_9$, and which has a bismuth layer structure in the range of $0<x<1$, the solid solution of the above formula satisfying $2.4<(1-x)a+xq<3.1$, $0<b<1.1$, $0.9<(1-x)c+xr<2.1$, and $0<p<0.6$.

The piezoelectric ceramic composition of the present invention contains no PbO and is therefore effective from the ecological point of view and in view of the prevention of environmental pollution.

Further, the piezoelectric ceramic composition of the present invention has a high Curie point as compared with any one of the conventional materials (PZT and PT) containing PbO, $BaTiO_3$ and the composition disclosed in JP-A-9-100156 and can be used at higher temperatures.

DETAILED DESCRIPTION OF THE INVENTION

Figure 1:
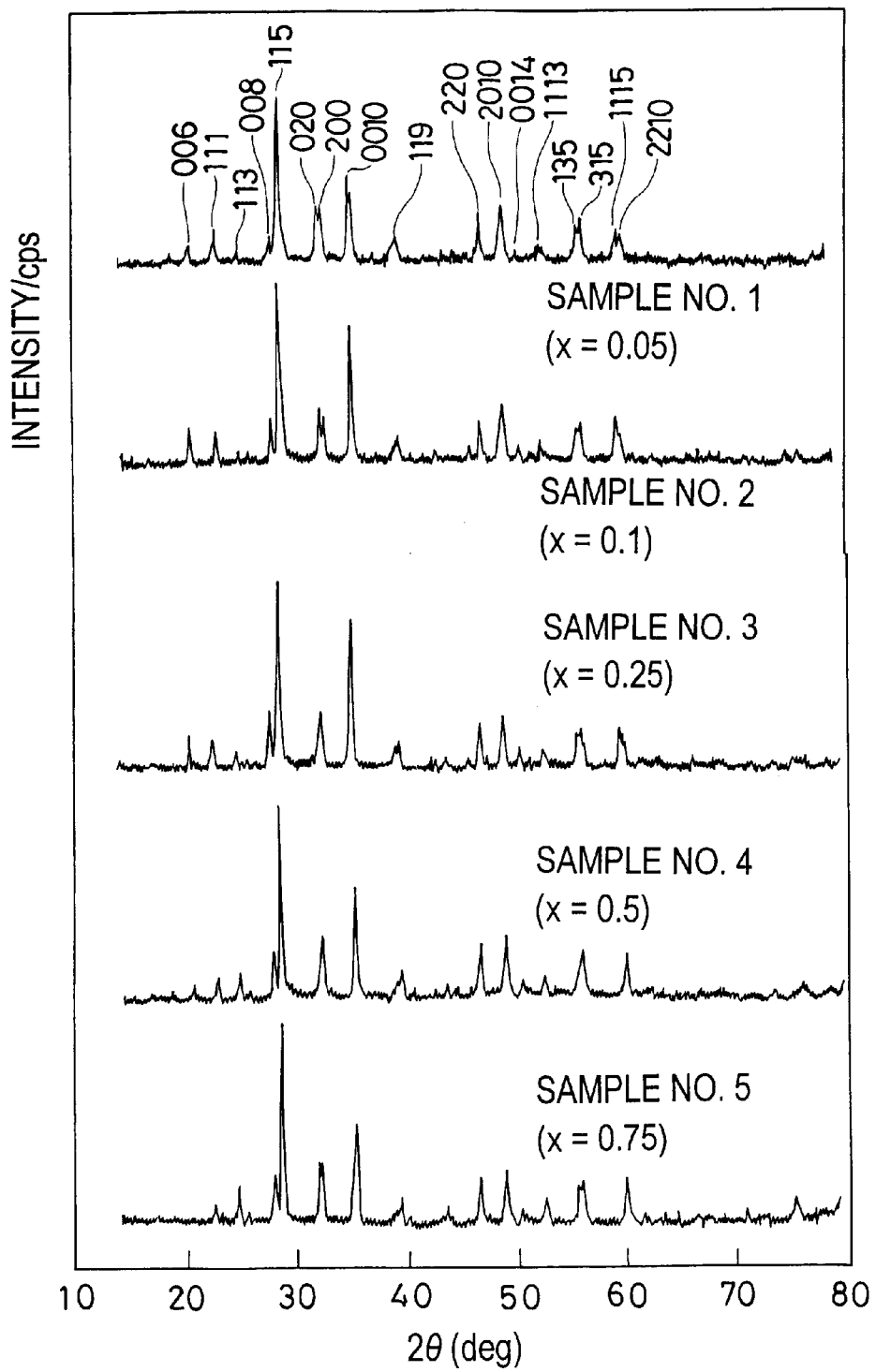
FIG. 1 shows results of X-ray diffractions of Samples Nos. 1 to 5 in Example.

The specific constitution of the present invention will be explained hereinafter.

The piezoelectric ceramic composition of the present invention is a solid solution whose main component is an entirely lead-free two-component-based solid solution of the formula of $(1-x)Bi_aTi_bNb_cO_9$-$xNa_pBi_qNb_rO_9$, and which has a bismuth layer structure in the range of $0<x<1$.

In the above formula, $2.4<(1-x)a+xq<3.1$, $0<b<1.1$, $0.9<(1-x)c+xr<2.1$, and $0<p<0.6$ are satisfied. The oxygen content may deviate from its stoichiometric compositional amount.

When the content of each component, particularly the Bi content, of the piezoelectric ceramic composition of the present invention is within the above range, the piezoelectric ceramic composition has a bismuth layer structure and has a high Curie point, specifically a Curie point of 500° C. or higher. As a ususal composition, the two-component-based piezoelectric ceramic composition of $(1-x)Bi_aTi_bNb_cO_9$-$xNa_pBi_qNb_rO_9$, provided by the present invention, has the formula in which a=3, b=1, c=1, p=0.5, q=2.5 and r=2. That is, it is a composition of

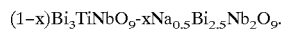

$$(1-x)Bi_3TiNbO_9\text{-}xNa_{0.5}Bi_{2.5}Nb_2O_9.$$

Further, the above piezoelectric ceramic composition also contains additives such as Mn, and the like. When these additives are added, the piezoelectric ceramic composition has a remarkably improved mechanical quality coefficient Qm. The amount of these additives based on the above composition is preferably 0.005 to 1% by weight, more preferably 0.1 to 0.8% by weight, particularly preferably 0.2 to 0.5% by weight. The additives such as Mn are generally added in the form of $MnCO_3$ or $MnO_2$.

The piezoelectric ceramic composition of the present invention has an acicular or plate-like crystal form, characteristic of a bismuth layer structure.

The method of producing the piezoelectric ceramic composition of the present invention will be explained hereinafter.

As starting materials, there are used powdery materials of bismuth oxide ($Bi_2O_3$), sodium carbonate ($Na_2CO_3$), titanium oxide ($TiO_2$), niobium oxide ($Nb_2O_5$), and the like. Preferably, the powdery materials which have been fully dried at 100° C. or higher are weighed so as to have a final composition in the above range specified in the present invention, and the powdery materials are mixed in a ball mill in the presence of an organic solvent (e.g., acetone) for 5 to 20 hours, to obtain fully mixed powdery materials. The mixed powdery materials are fully dried and press-shaped, and the press-shaped mixture is calcined at approximately 750 to 900° C. for about 1 to 3 hours. Further, the calcined mixture is milled in a ball mill or the like for 10 to 30 hours and dried, a binder is added, and the mixture is granulated. Then, the granulated powder is press-shaped to form, e.g., pellets, and the press-shaped material is heat-treated at 400 to 600° C. for 2 to 4 hours, to volatilize the binder. Then, the resultant material is fired at approximately 900 to 1,350° C. for 2 to 4 hours. The firing condition is that both the temperature elevation rate and the temperature decrease rate are 80 to 150° C. per minute. A piezoelectric ceramic composition obtained by the firing is polished as required, and an electrode is provided.

EXAMPLES

The present invention will be explained more in detail with reference to specific Examples of the present invention hereinafter.

As starting materials, powdery materials of bismuth oxide ($Bi_2O_3$), sodium carbonate ($Na_2CO_3$), titanium oxide ($TiO_2$) and niobium oxide ($Nb_2O_5$) were provided, and weighed such that a final two-component-based piezoelectric ceramic composition had a composition of $(1-x)Bi_3TiNbO_9$-$xNa_{0.5}Bi_{2.5}Nb_2O_9$ in which x was as shown in Table 1. Then, these powdery materials were mixed in a ball mill using zirconia balls in the presence of acetone as a solvent for approximately 10 hours. The mixed powdery materials were fully dried, press-shaped and calcined at 800° C. for 2 hours. The press-shaped mixture was again milled in the ball mill and then dried, PVA (polyvinyl alcohol) was added as a binder, and the mixture was granulated. The granulated powder was shaped into disc-shaped pellets having a diameter of 20 mm and a thickness of 1.5 mm with a single-axis press-shaping machine under a load of 196 MPa. The pellets were heat-treated at 500° C. for 3 hours to volatilize the binder and then fired at a firing temperature of 1,100° C. for 2 hours. The firing condition was that both the temperature elevation rate and the temperature decrease rate were 100° C./minute. The sample obtained by the firing was polished to form a parallel flat plate having a thickness of approximately 0.5 mm, and a silver paste was baked at 550° C. to form electrodes. Then, an electric field of about 7 MV/mm was applied to the sample in a silicone oil bath at 200° C. for 30 minutes. Then, the sample was measured for mechanical quality coefficient of a radial mode, Qm, with an impedance analyzer. Then, the sample was cut with a dicing saw to give piezoelectric samples Nos. 1 to 5 of Examples.

The above-obtained piezoelectric samples Nos. 1 to 5 as a piezoelectric ceramic compositions were measured for X-ray diffractions. FIG. 1 shows the results. Then, lattice constants were calculated with regard to the above piezoelectric samples Nos. 1 to 5 as piezoelectric ceramic compositions. Table 1 shows the results. In the lattice constants shown in Table 1, Miller indices and c axis alone are very large (about five times as large as a axis and b axis), so that it is seen that the piezoelectric ceramic compositions of this Example had a bismuth layer structure.

Further, each piezoelectric sample was measured for a Curie point and an electromechanical coupling coefficient of length-extension mode (k33). Table 1 shows the results. In addition, the electromechanical coupling coefficient of length-extensional (k33) and the mechanical quality coefficient (Qm) were calculated on the basis of a resonance and anti-resonance method using an impedance analyzer according to EMAS6000 series (Standards of Electronic Manufactures Association of Japan).

Comparative Examples

Comparative piezoelectric samples Nos. 6 and 7 were obtained in the same manner as in Example 1 except that the raw materials were replaced with barium titanate ($BaTiO_3$) or $0.97(Bi_{0.5}Na_{0.5})TiO_3$-$0.03NaNbO_3$. The obtained samples Nos. 6 and 7 were measured for Curie points, electromechanical coupling coefficients of length-extension mode (k33) and mechanical quality coefficients (Qm) in the same manner as in Example. Table 1 also shows the results.

TABLE 1

List of Characteristics of $(1-x)Bi3TiNbO9$-$xNa0.5B12.5Nb2O9$

| Sample No. | Composition x | Lattice constant a(Å) | b(Å) | c(Å) | Curie point (° C.) | k33(%) | Qm |
|---|---|---|---|---|---|---|---|
| 1 | 0.05 | 5.399 | 5.446 | 25.09 | 905 | 6.45 | 682 |
| 2 | 0.10 | 5.408 | 5.442 | 25.09 | 896 | 15.3 | 606 |
| 3 | 0.25 | 5.419 | 5.451 | 25.07 | 880 | 11.1 | 569 |
| 4 | 0.50 | 5.438 | 5.466 | 25.05 | 840 | 8.54 | 1576 |
| 5 | 0.75 | 5.446 | 5.465 | 25.02 | 806 | 7.11 | 507 |
| 6* | $BaTiO_3$ | | | | 120 | 49.3 | 430 |
| 7* | $0.97(Bi_{0.5}Na_{0.5})TiO_3$-$0.03NaNbO_3$ | | | | 341 | 43.3 | 238 |

*comparison

Table 1 shows that since the piezoelectric ceramic composition of the present invention has a remarkably high Curie point as compared with the piezoelectric ceramics completely free of lead oxide, such as $BaTiO_3$ and (BiNa) $TiO_3$-$NaNbO_3$, it retains piezoelectric characteristics at high temperatures at which the conventional piezoelectric ceramics cannot be used. Although the samples of Examples of the present invention showed lower electromechanical coupling coefficients of length-extension mode than the samples of Comparative Examples, the samples of Examples showed length-extensional electromechanical coupling coefficients of more than 6%, which are values to cause no particular problems on a sensor, a resonator, etc., for use at high temperatures.

What is claimed is:

1. A piezoelectric ceramic composition whose main component is a two-component-based solid solution of the formula of $(1-x)Bi_aTi_bNb_cO_9$-$xNa_pBi_qNb_rO_9$, and which has a bismuth layer structure in the range of $0<x<1$, the solid solution of the above formula satisfying $2.4<(1-x)a+xq<3.1$, $0<b<1.1$, $0.9<(1-x)c+xr<2.1$, and $0<p<0.6$.

* * * * *